United States Patent [19]

Champavier

[11] Patent Number: 4,710,748
[45] Date of Patent: Dec. 1, 1987

[54] METHOD AND DEVICE FOR CONVERTING AN ANALOG SIGNAL INTO A PULSE SIGNAL

[75] Inventor: Louis Champavier, Mouans Sartoux, France

[73] Assignee: Vita Center Inc., Panama, Panama

[21] Appl. No.: 662,261

[22] Filed: Oct. 18, 1984

[30] Foreign Application Priority Data

Jan. 16, 1984 [FR] France .................................. 84 01076

[51] Int. Cl.$^4$ ............................................ H03K 13/00
[52] U.S. Cl. ...................... 340/347 AD; 340/347 DA
[58] Field of Search ................. 340/347 AD, 347 CC, 340/347 DA

[56] References Cited

U.S. PATENT DOCUMENTS

| | | |
|---|---|---|
| 3,737,892 | 6/1973 | Dorey .......................... 340/347 AD |
| 3,740,586 | 6/1973 | Banks et al. . |
| 3,750,142 | 7/1973 | Barnes et al. ................. 340/347 CC |
| 3,824,584 | 7/1974 | Coia . |
| 3,899,429 | 8/1975 | Ueno et al. . |
| 4,118,698 | 10/1978 | Becker .......................... 340/347 CC |
| 4,417,234 | 11/1983 | McKenna ..................... 340/347 AD |
| 4,463,343 | 7/1984 | Guillemot ..................... 340/347 AD |
| 4,528,549 | 7/1985 | Simpson ....................... 340/347 AD |

Primary Examiner—William M. Shoop, Jr.
Assistant Examiner—Sharon D. Logan
Attorney, Agent, or Firm—Schweitzer & Cornman

[57] ABSTRACT

The disclosure is directed to a method and device for converting an analog signal into a pulse signal. Pursuant to the invention, the signal conversion is accomplished in cycles, each comprising generating a first standard signal varying from a reference value at predetermined instants of time, comparing the analog signal to be converted from said instants of time to said standard signal, emitting a pulse when the value of the standard signal reaches the value of the analog signal, and deriving the reference value for the next cycle from the value the analog signal had when said pulse was emitted. The invention also provides for the utilization of the signal conversation method and device in closed loop applications, for example, in transmission or control systems.

29 Claims, 23 Drawing Figures

Fig:1

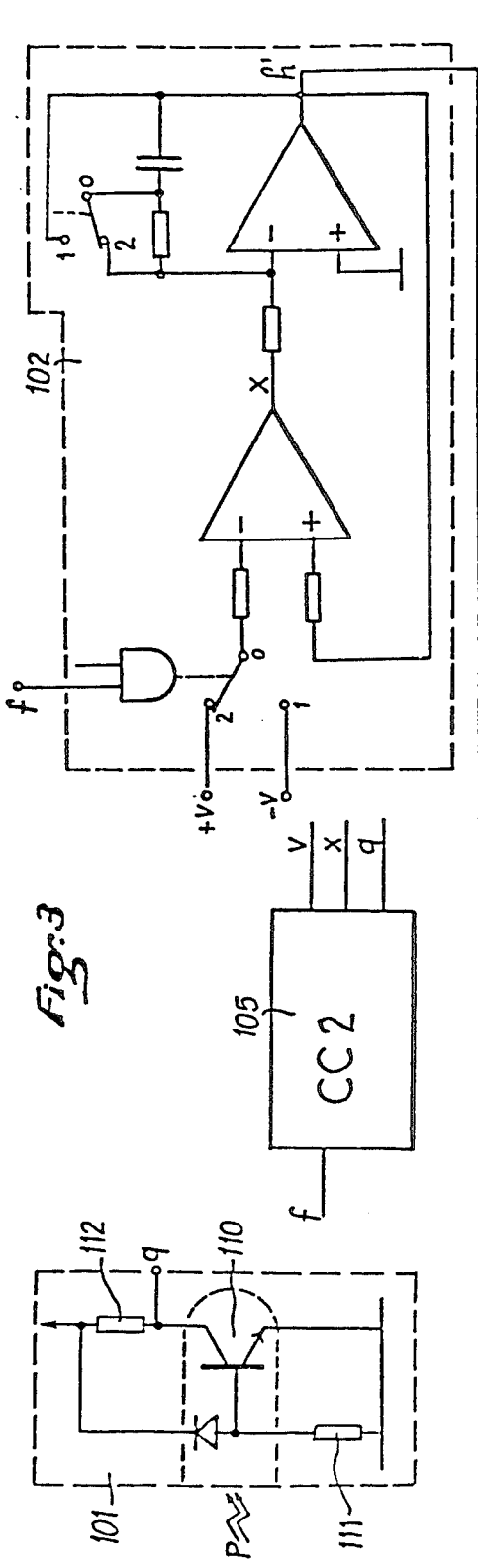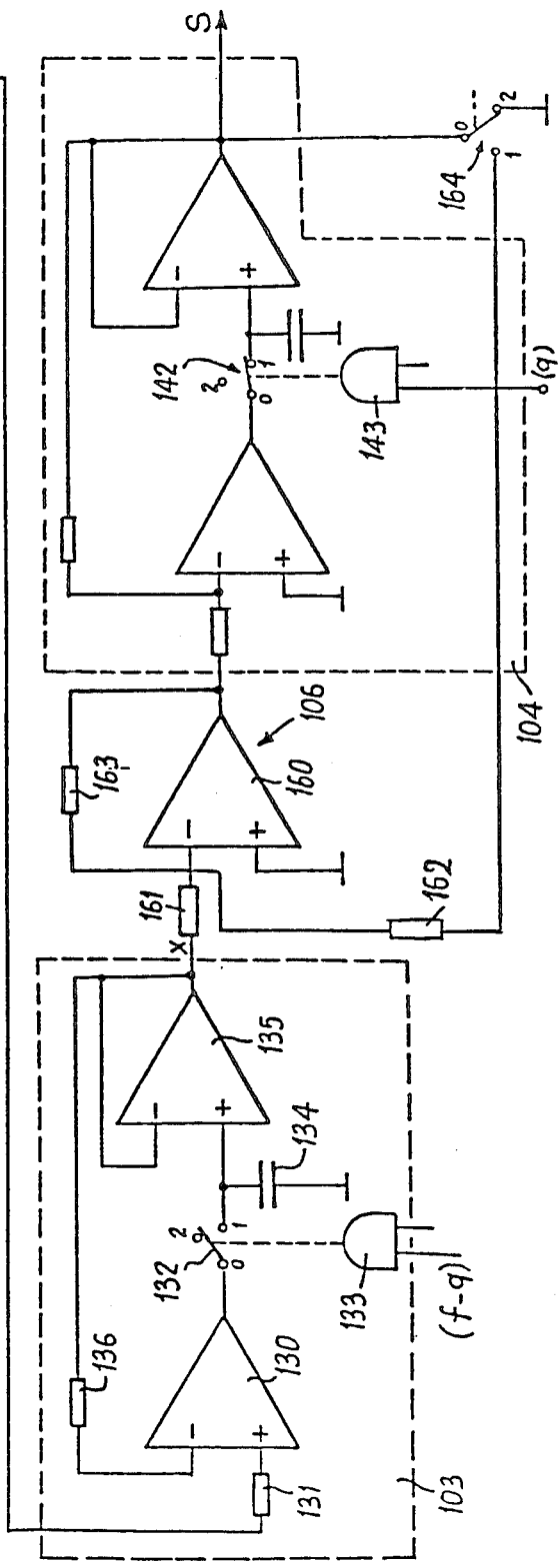
Fig. 3

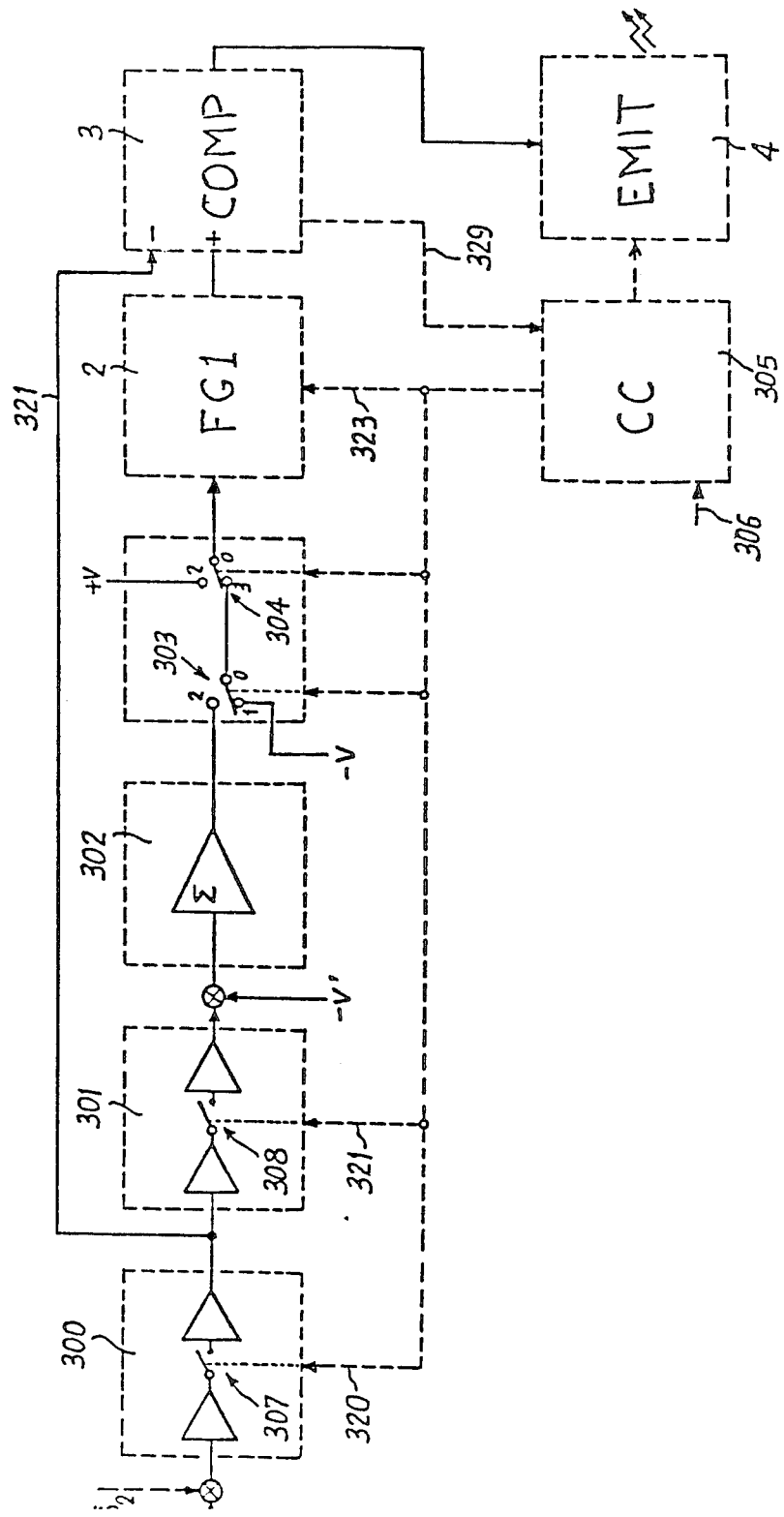

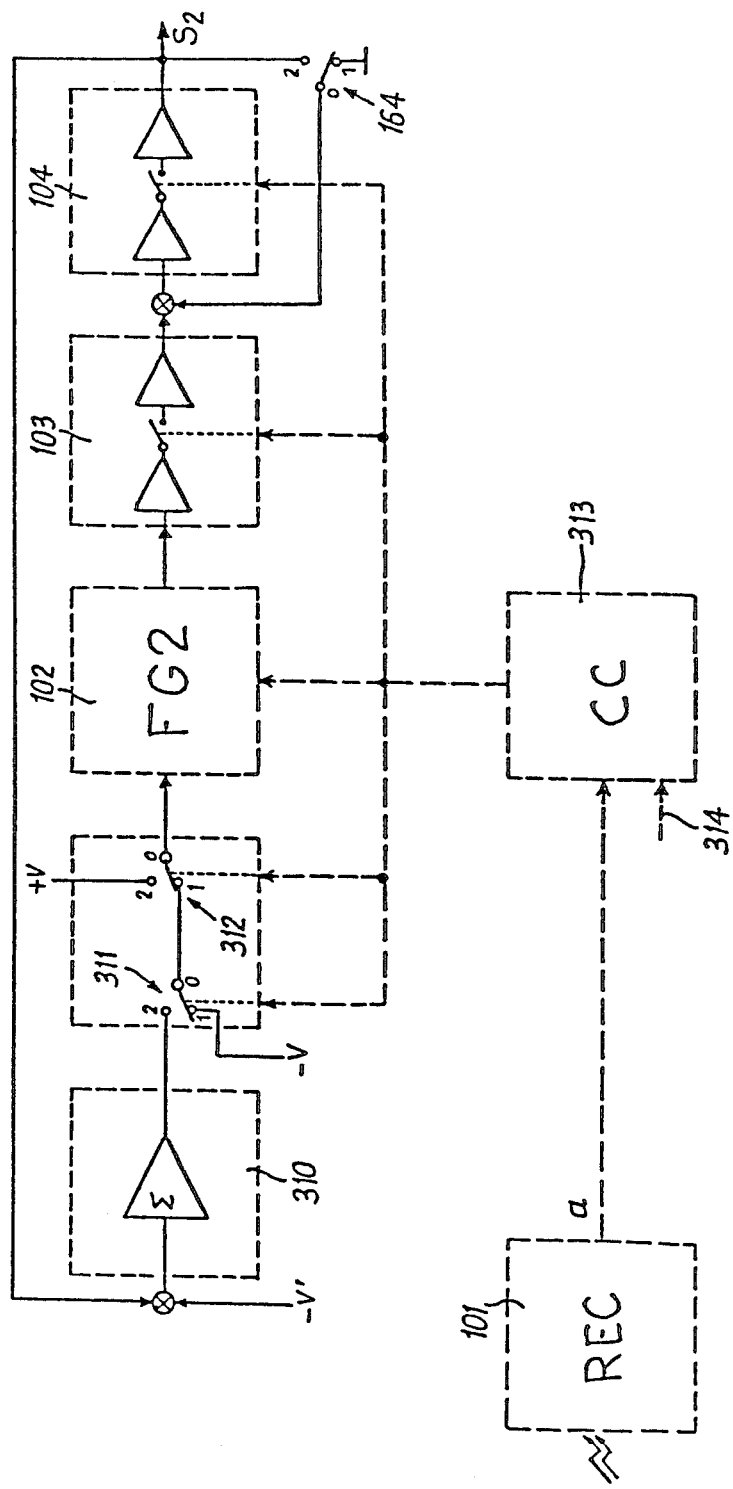

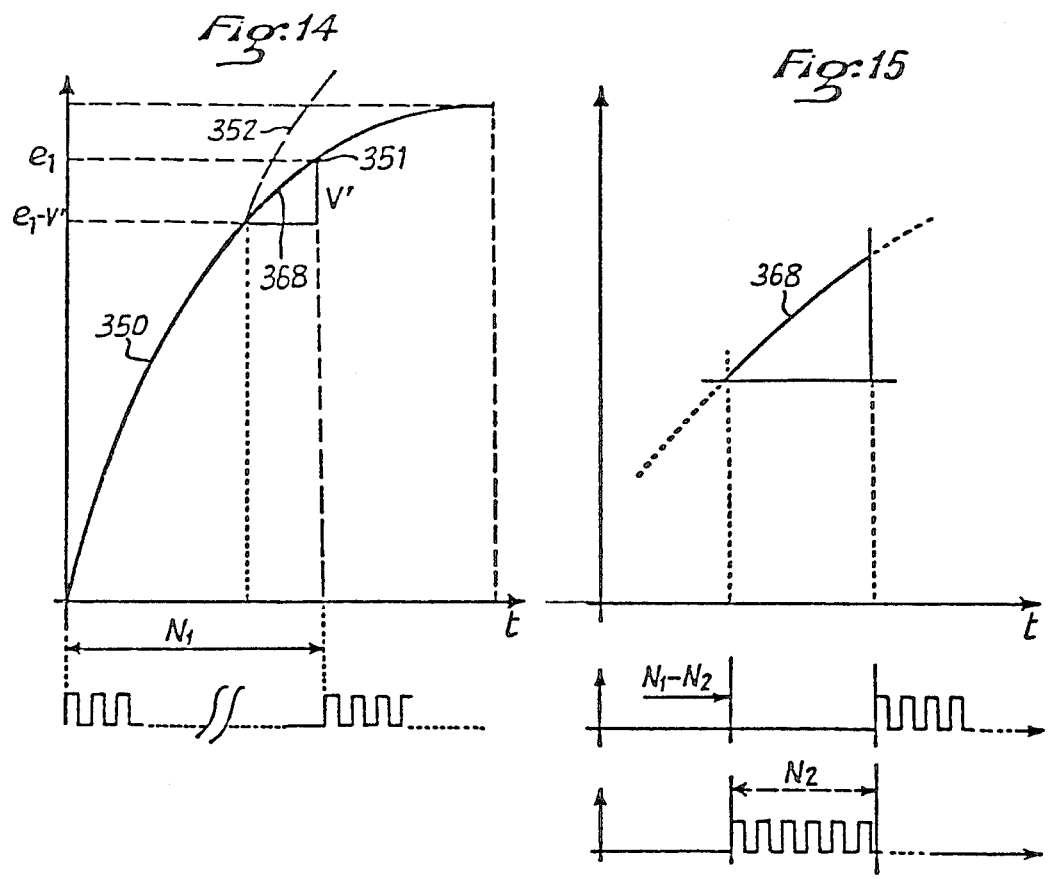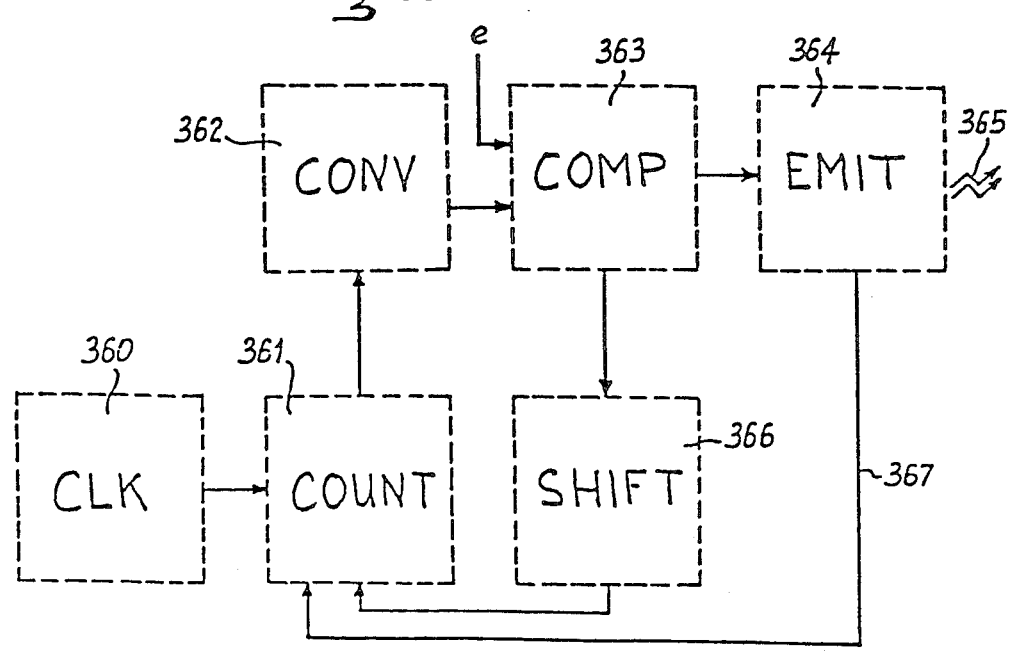

METHOD AND DEVICE FOR CONVERTING AN ANALOG SIGNAL INTO A PULSE SIGNAL

This invention relates to a method for converting an analog signal into a pulse signal, a reverse conversion method, devices for implementing these methods, and transmission systems and control and regulation systems using such devices.

Three families of converters are known in the previous art.

Analog to Digital Converters (A.D.C.) convert an analog signal into a signal consisting of a certain number of bits (0 or 1) or pulses that together represent the numerical value of the analog signal at a given instant. Numerous types of such A.D.C.'s are known, for instance: A.D.C. integrators, iterative A.D.C., parallel A.D.C., digital A.D.C. and voltage/frequency converters.

Digital to Analog Converters (DAC) have an opposite function. They decode the digital information carried in a word of a certain number of bits so as to give the analog value of a signal. They mainly include D.A.C. with resistors and D.A.C. with R—2R scale.

Finally isolation amplifiers aim at electrically insulating two stages of a system and for that purpose they feature an input circuit that is isolated from the power source as well as from the output circuit. Such an isolation is recommended for applications where people safety is at stake, such as in the medical field, or for measures that need be unperturbed by outside sources. Most isolation amplifiers known are based on electromagnetic phenomena.

Converters from these three families are called upon the cooperate in many applications. However, as they are based on radically different principles, their cooperation usually gives way to undesirable problems.

Besides, an analog signal is translated into digital form by a number of pulses that can be relatively high when sufficient precision is required. New problems also arise when processing such high number of pulses.

It is a primary object of the invention to substantially eliminate those disadvantages by providing a conversion method of an analog signal into a pulse signal together with a reverse conversion method that are of a simple design and that can be implemented by using easily compatible devices.

For that purpose the invention first relates to a method for converting an analog signal into a pulse signal wherein a first standard signal that varies from a reference value starts to be generated at predetermined instants of time, the analog signal is compared from said instants of time to said standard signal, and a pulse is emitted when the value of the standard signal reaches that of the analog signal.

The invention is also related to a reverse conversion method, that is to say a method for converting a pulse signal obtained by way of the aforementioned method, into an analog signal, wherein a second standard signal varying from a second reference value starts to be generated at instants of time synchronized with said pulse signal, the value of this second standard signal is recorded at the time said pulse is received, and this value is memorized until the next pulse is received.

It can thus already be noted that the pulse signal that codes the analog signal is a "monobit" signal, in that the value of the analog signal is represented by a single pulse.

Should the analog signal be an electric voltage varying as a function of time, as will be assumed for the rest of this specification, the direct conversion according to the invention is in fact a conversion of voltage into time whereas the reverse conversion is a conversion of time into voltage. Indeed the method according to the invention amounts to coding the value of the voltage analog signal by the time elapsed from a predetermined instant of time when a cycle of the standard signal has started, until the instant of time when this standard signal has reached the value of the analog signal, at which latter instant of time the pulse is emitted.

Consequently, if a second standard signal is available, that may be identical to the first one or not, and if this second standard signal is synchronized with the first one, the value of the original analog signal can be reversely derived from the time that elapsed between the beginning of the cycle of the second standard signal and the reception of the pulse resulting from the direct conversion. This analog value once decoded is memorized until it can be actualized when receiving the next pulse.

In a preferred embodiment of the invention, the pulse is continued until the predetermined instant of time when the next standard signal starts to be generated.

This embodiment offers the advantage that the second standard signal can then be synchronized with the first one by way of the trailing edge of the pulses. Thus each pulse carries two informations: the leading edge represents the value of the signal, whilst the trailing edge in used for synchronizing the reverse conversion. For instance, a cycle of the second standard signal can be initiated each time the trailing edge of the pulse is received.

It can thus be noted that in this embodiment the analog signal is coded by means of a pulse signal that has a fixed frequency and a modulated pulse width.

In the direct conversion method the standard signal can be a periodic signal, said predetermined instants of time being then separated be a time interval equal to the period of the standard signal, which amounts to sample with a fixed frequency.

However, in another embodiment, said instants of time are the instants of time when the standard signal reaches the value of the analog signal in the previous comparison.

Using a periodic signal as a standard signal offers obviously the advantage of simplicity.

However, all that part of the standard signal running beyond the time when the standard signal reaches the value of the analog signal remains unused, as one waits for the next cycle of the standard signal before carrying out another conversion. Therefore, the analog signal as generated during the reverse conversion is somewhat different from the original analog signal.

On the contrary, if a new cycle of the standard signal is begun as soon as said standard signal reaches the value of the analog signal—to the minimal width of the pulse—this unused part of the cycle is suppressed, which amounts to increasing the sampling frequency, at least when the analog signal has a value remaining close to the reference value at which each cycle of the standard signal begins.

In the same way as two embodiments can be considered with regard to the predetermined instants of time when each cycle of the standard signal begins, two embodiments can be considered with regard to the reference value at which these cycles start.

This reference value can first be a fixed value which leads, as will be explained later, to a relatively simple operational device. This fixed value may be modulated by any external parameter. However it is necessary during each cycle to wait for the standard signal to vary from this fixed value to the value of the analog signal to be converted before having the result of the conversion.

When these two values are remote from one another, the conversion time is rather long. As a result, during the reverse conversion, the previous sampled value is memorized during this full tie interval and the value of the original analog signal is liable to diverge noticeably from it.

This is the reason why, in the other embodiment, the reference value is derived from the value that the analog signal had when this latter was reached by the value of the standard signal during the previous comparison, i.e. it is derived from the value sampled during the previous cycle. In this latter case, each new cycle of the standard signal can thus begin as close as possible to the previous sampled value. For an analog signal that varies relatively slowly with regard to the sampling frequency the result is that, in all cases, the standard signal reaches quickly at each cycle the value of the analog signal to be converted, which consequently amounts to an increase in the sampling frequency.

In this latter case it should be noted that the method according to the invention is an adaptive process since at each cycle the reference value of the standard signal is a function of the previous sampling value.

In the simplest embodiment of this adaptive process the reference value is equal to said value that the analog signal had to which is algebraically added a predetermined quantity.

In other words, the reference value of each cycle is equal to the sampling value of the previous cycle increased or decreased by this predetermined quantity.

With regards to the shape of the standard signal it may be a ramp but any other shape, for instance a sine curve or an exponential may be used.

When the second standard signal used in the reverse conversion is identical to that used in the direct conversion, the analog signal as regenerated is equivalent to the original one. However, by using a second standard signal different from the first one, it is extremely easy to realize any modification of the original signal that may be wished.

For instance by using two proportional standard signals, a regenerated signal proportional to the original one is obtained. However, some radical modifications of the original signal can also be made. For instance if an exponential original signal is considered and if a standard signal for direct conversion also exponential is used together with a ramp-shaped second standard signal for reverse conversion, it can be easily shown that the regenerated signal is also a ramp-shaped signal. This latter property has some very interesting applications in the field of sensor linearization or in process control.

Some other transformations of the input signal can also be made by using standard signals of different frequencies for direct and reverse conversions.

When the standard signal is a ramp, it is particularly easy to generate it by analog means. However, in some cases it may be interesting to generate it by digital means in particular for standard signals of complex shape.

In this latter case, it is possible to count clock pulses in a counter and convert, for each pulse from the clock, the contents of the counter into an analog signal that is then used as a standard signal.

This latter embodiment can be preferred in particular in the case of an adaptive process as hereinabove described in which the standard signal is non linear.

Indeed it is easier in such a case to derive the reference value of each cycle of the standard signal from the previous value by digital rather than by analog means. In particular, for adding algebraically a predetermined quantity to the previous sampling value it is enough to cause the counter to shift of a given number of bits.

The invention is also directed to a device for implementing the hereinabove described conversion method, which device includes function generating means for generating the standard signal, comparison means for comparing the analog signal to the standard signal, and emetting means for emitting a pulse when the comparison means detect the equality between the analog signal and the standard signal.

The invention is also related to a device for implementing the reverse conversion method which device includes receiving means for receiving the pulses of the pulse signal, second function generating means for generating the second standard signal, means for synchronizing said second standard signal with said first standard signal, and means for memorizing the value reached by said second standard signal at the time when a pulse is received.

The similarity between both device should be noted whereas for instance, an A.D.C. has nothing in common with a D.A.C. In particular the direct conversion device and the reverse conversion device should include function generating means which can be designed along the same lines.

The reverse conversion device includes of course synchronizing means so as to synchronize the second standard signal with the first one in order to provide a time origin from which to determine the instant of time when the pulse is received.

Moreover the reverse conversion device includes memorizing means for memorizing the analog value regenerated when each pulse is received until the next pulse is received.

The function generating means for direct conversion may in particular be a ramp generator for a ramp with a vertical trailing edge, this vertical trailing edge securing an excellent synchronization of both function generators in all cases.

The function generator is best arranged so that the extreme values of the ramp are greater in absolute value than the peak value of said analog signal.

This arrangement makes available a marker at each end of the ramp so that the device makes sure to transmit a pulse for each cycle of the standard signal.

It will be noticed hereinafter that these two markers play another role in the resetting of the reverse conversion device.

In order to realize, as hereinabove mentioned, a modulation of the width of the pulses emitted, the comparison means in the direct conversion device is arranged in a particular embodiment so as to provide pulses the leading edge of which corresponds to the detection of an equality between the analog and standard signals and the trailing edge of which corresponds to said predetermine instants of time when the next standard signal starts to be generated.

In the case where the reference value of the first standard signal is derived from the last sampled value, the device according to the invention may further include first sample-hold means on the input of which said analog signal is applied, second sample-hold means on the input of which the output of the first sample-hold means is applied, means for setting the first sample-hold means into HOLD mode and the second one into COPY mode when the equality between the analog signal and the standard signal is detected by said comparison means, and for setting the first-sample hold means back into COPY mode and the second sample-hold means back to HOLD mode at said predetermined instant of time when the next standard signal starts to be generated, and means for deriving said reference value of the standard signal from the output of said second sample-hold means.

Thus, at the beginning of a cycle of the standard signal the first samplehold means are on COPY mode so that their output follows the input analog signal. As soon as the comparison means establish that the standard signal has become equal to the analog signal to be converted, they cause a pulse to be emitted and simultaneously the first sample-hold means are set into HOLD means so that their output records the sampled value. The second sample-hold means which are then on COPY mode have their output progressively brought up to said sampled value after what the reference value for the next cycle of the standard signal can be established.

In particular, the means for deriving said reference value from the output of the second sample-hold means can include an amplifier for algebraically adding a predetermined quantity to said output.

The input of the comparison means corresponding to the analog signal is best connected to the output of the first sample-hold means.

This makes it possible to keep the comparison voltage of the comparison means at a constant level during the whole duration of the pulse.

In the reverse conversion device, the means for memorizing the value of the second standard signal comprise preferably third sample-hold means the input of which is connected to the output of the second function generating means and means for setting these third sample-hold means into HOLD mode when said pulse is received, and for setting them back into COPY mode when the next standard signal starts to be generated.

The output of the third sample-hold means thus follows the output of the second function generating means as long as a pulse from the direct conversion device is not received. Then, when this pulse is received, their output remains at a constant value equal to the last value as sampled in the direct conversion device, if both standard signals are identical.

The means for memorizing the second standard signal may further include fourth sample-hold means the input of which is connected to the output of the third sample-hold means and means for setting the fourth sample-hold means on COPY mode when the third ones are on HOLD mode and reversely.

Consequently, as soon as the reverse conversion device receives a pulse, the output of the first sample-hold means remains at a constant value and the output of the third sample-hold means copies this value and keep it until the next pulse is received. The output signal from the fourth samplehold means is thus an analog step signal representing the original analog signal, that can be smoothed if so wished.

The invention also relates to an open loop transmitting system for an analog signal comprising a direct conversion device as hereinabove described on the input of which the signal to be transmitted is applied, a reverse conversion device as hereinabove described, and means for coupling the output of the direct conversion device to the input of the reverse conversion device.

The transmitted signal is thus the pulse signal that results from the direct conversion of the analog signal. This pulse signal is then converted back when received so as to restore an analog signal equivalent to the analog signal to be transmitted.

The invention is also directed to a closed loop transmission system for an analog signal comprising on its direct loop an amplifier for substracting the transmitted signal from the signal to be transmitted, a first direct conversion device as hereinabove described on the input of which the output signal from the amplifier is applied, a reverse conversion device as above described, means for coupling the output of the first direct conversion device to the input of the first reverse conversion device, and means for feeding the output of the first reverse conversion device back onto itself.

In such conditions, the signal that is actually transmitted is only the difference between the transmitted signal and the signal to be transmitted.

By feeding the output of the first reverse conversion device back onto its input, the signal to be transmitted is restored from this difference signal.

In a particular embodiment, this transmission system has on its feed-back loop a second direct conversion device as described above on the input of which the transmitted signal is applied, a second reverse conversion device as above described the output of which is applied to the input of the amplifier, and means for coupling the output of the second direct conversion device to the input of the second reverse conversion device.

In this case, the feed-back loop is virtually identical to the direct loop. It is in particular possible to disconnect the direct and feed-back loops thus providing two open loops transmission systems.

The invention also relates to a control system for a power unit comprising at least one direct conversion device of the above mentioned type in which the comparison means are so arranged as to provide pulses the leading edge of which corresponds to the detection of the equality between the analog and standard signals and the trailing edge of which corresponds to said predetermined instants of time when the next standard signal starts being generated, means for providing the input of this device with a control signal, and means connected to the output of this device for applying a power source to said power unit as long as the output pulses last and not applying it otherwise.

Indeed it has been said that such a device provides a pulse signal in which the width of the pulses is modulated by the input signal. As a result, in a control system such as described above, the power unit is alternatively connected to and disconnected from the power source, the proportion of time during which it is connected to that source being a function of the control signal.

Such a control system can be used for example in the feeding of the resistors of a heating system or of a DC motor through a thyristors bridge controlled by the device according to the invention.

The invention is also related to a regulation system comprising a direct loop and a feed-back loop, said direct loop comprising at least one direct conversion device as described above and means for providing the input of this device with an analog signal equal to the difference between a control signal and the feed-back signal, these latter means preferably comprising an amplifier with proportional gain.

A control system as hereinabove described which would be looped onto itself would substantially correspond to this regulation system.

In this case, the analog signal converted into a pulse signal consists in the difference between the control signal and the actual value of the parameter to be regulated as transmitted by the feed-back loop, for instance the temperature or the current in the DC motor of the previous examples.

Such a regulation system may also include in its direct loop a reverse conversion device as described above and means for coupling the output of the direct conversion device to the input of the reverse conversion device.

Such an arrangement can be used when it is wished to provide an output signal that is an analog signal representative of the input analog signal, or when it is wished to isolate the input from the output of the system.

The regulation can then be accomplished by having an amplifier disposed between the third and fourth sample-hold means of the reverse conversion device so as to provide the input of the fourth sample-hold means with a signal equal to the sum of the output signals from the third and fourth sample-hold means.

In a preferred embodiment of the invention, the feed-back loop also includes a direct conversion device and a reverse conversion device, and means for coupling the output of the first said device to the output of the second one.

It will be understood that, in these conditions, the direct and feed-back loops are identical. This characteristic offers numerous advantages.

Indeed it is then possible to readily switch from an open loop mode to a closed loop mode. When the system is operating as two separate open loops, the order and its execution can be simultaneously observed. Conversely, when operating in closed loop it is possible to realize a regulation in either direction.

Other characteristics and advantages of the invention will become apparent from the following description of some preferred embodiments of the invention, given with reference to the accompanying drawings in which:

FIG. 3 shows an electrical circuit of a reverse conversion device according to the invention.

FI. 7 shows the operation of another embodiment of the invention.

Figure 8:
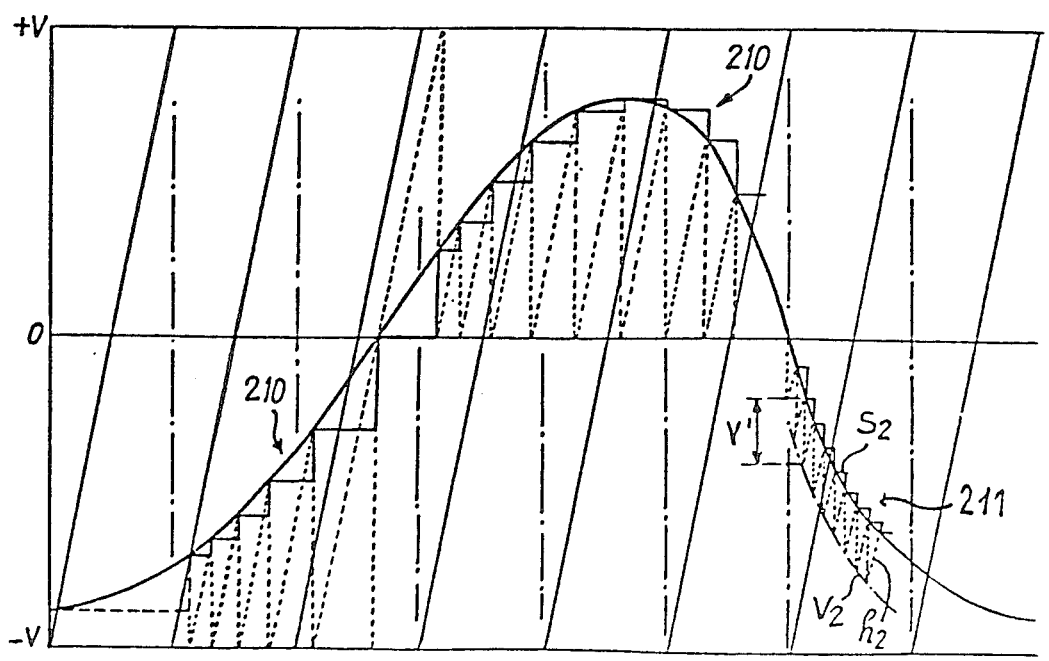

FIG. 8 shows the operation of two other embodiments of the invention.

FIG. 9 is a diagram of an adaptive direct conversion device according to the invention.

FIG. 10 is a diagram of an adaptive reverse conversion device according to the invention.

Figure 11:
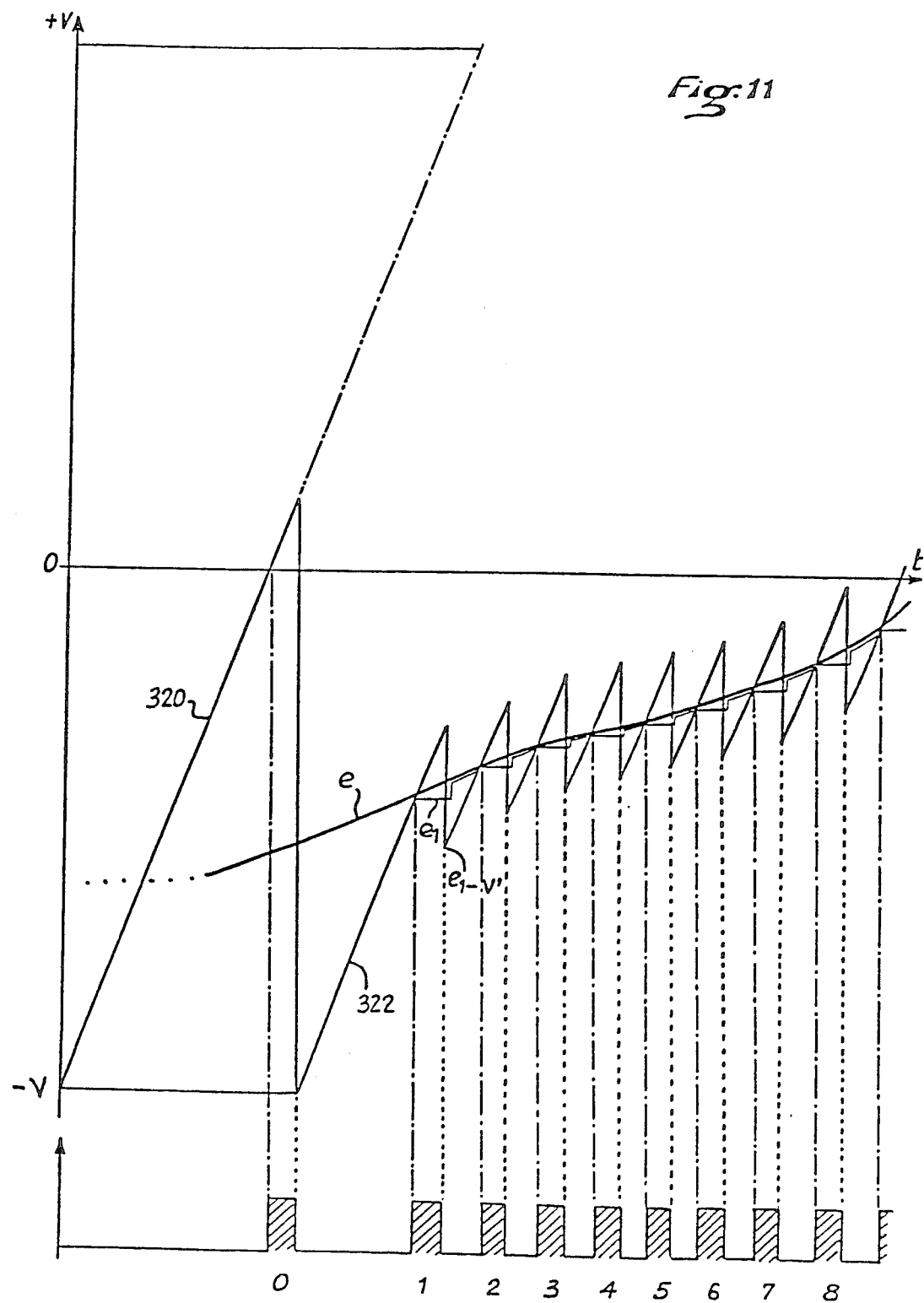

FIG. 11 shows the operation of the devices of FIGS. 9 and 10.

Figure 12:
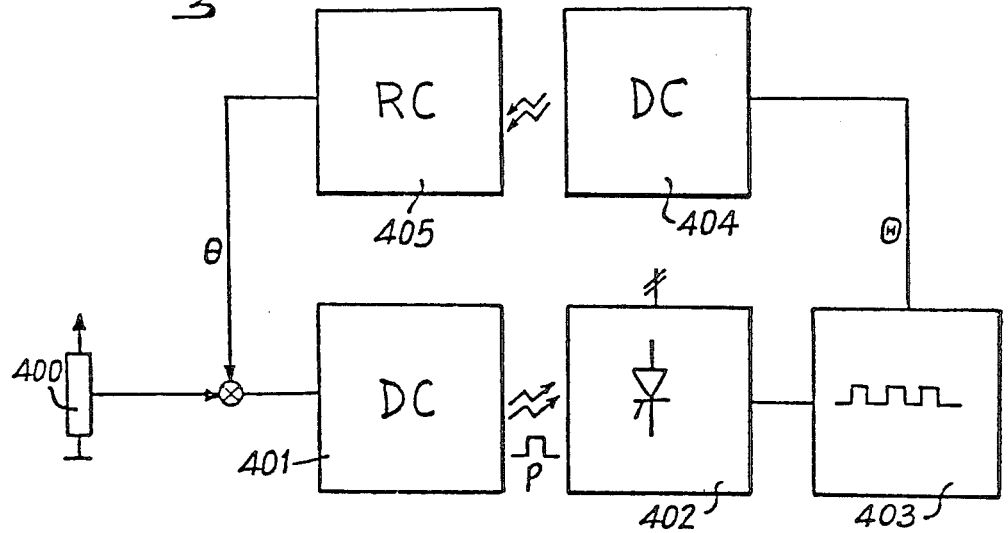

FIG. 12 shows a particular application of the invention.

Figure 13:
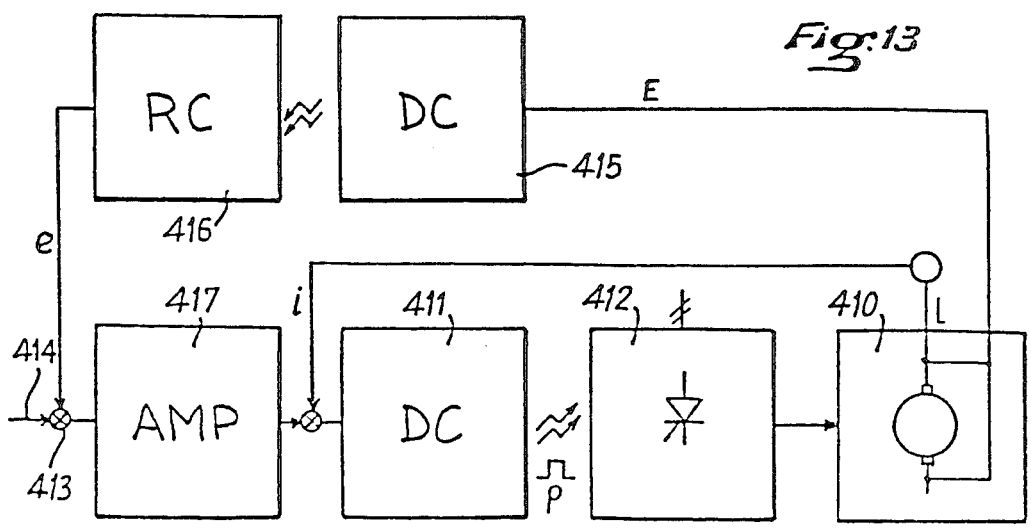

FIG. 13 shows another particular application of the invention.

FIG. 14 illustrates the case where the standard signal is generated by digital means.

FIG. 15 shows how the reference value is obtained in this latter case, and

FIG. 16 is a diagram of a device performing the direct conversion by digital means.

A summary of the symbols used for the various signals is given in the table at the end of present specification.

Figure 1:
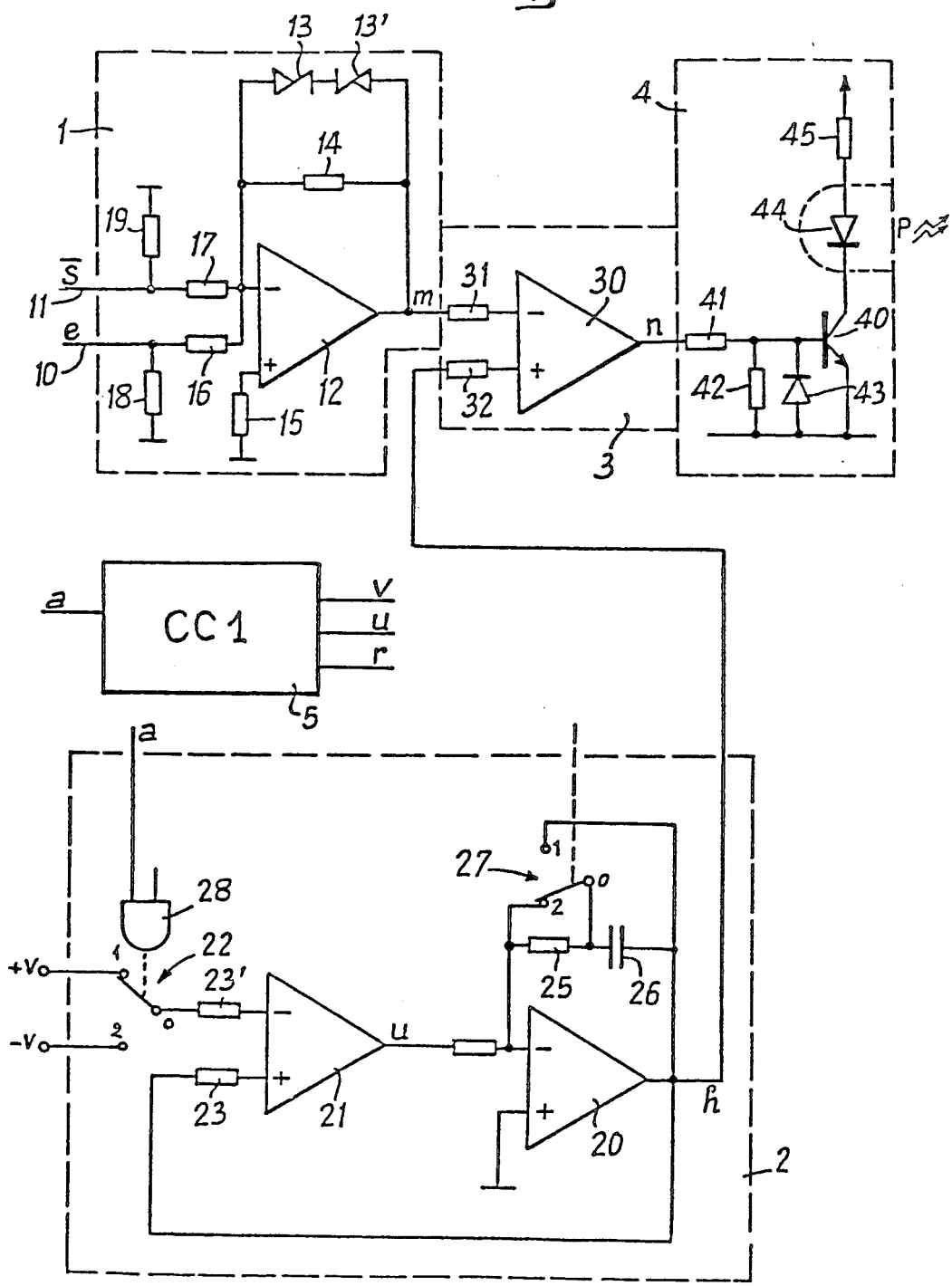
FIG. 1 shows an electrical circuit of a direct conversion device according to the invention

The direct conversion circuit shown of FIG. 1 comprises essentially a peak limiting summing device 1, a ramp generator 2, a comparator 3, and a transmitter 4.

The summing device 1 receives on one of its inputs 10 the analog signal (e) to be converted and eventually on its other input 11 a feed-back signal (s̄) that will be described herebelow. The transmitter 4 emits a pulse (p), for instance an optical signal, which is the pulse signal resulting from the conversion of the input signal. A control circuit (CC1) 5 handles the various logical and synchronization functions necessary for the operation of the circuit of FIG. 1.

The summing device 1 essentially comprises a differential amplifier 12 with proportional gain and symmetrical cut off.

Cut off is accomplished by two opposite Zener diodes 13 and 13' and the gain is determined as usual by a resistor 14. Zener diodes 13 and 13' on the one hand, and resistor 14 on the other hand, are connected in a well known manner in parallel between a negative input and the output of amplifier 12. Its positive input is grounded by way of a resistor 15.

Signals (e) and (s̄) are applied to the negative input of the amplifier 12 by way of resistors 16 and 19 that set the input voltage.

The operation of a circuit like the peak limiting summing device 1 is well known; it delivers at the output of the amplifier a signal (m) equal to the sum of signals (e) and (s̄) cut off at peak values set by Zener diodes 13 and 13'.

The ramp generator 2 also is of a well known type. It is essentially made of an amplifier 21 set as a comparator and of an electronic switch 22.

The amplifier 21 receives on its positive input, via a resistor 23, the output (h) from amplifier 20, and on its negative input, via a resistor 23', the voltage $-V$ or $+V$ according to the position of switch 22.

The output (u) of amplifier 21 is applied, via resistor 24, to the negative input of amplifier 20, the positive input of which is grounded.

Finally a resistor 25 or a capacitor 26 is connected between the negative input of amplifier 20 and the output thereof, according to the position of another switch 27.

Switch 27 as well as switch 22 are controlled by a logic gate 28.

Supposing now that switches 22 and 27 are turned on (0–2) as in FIG. 1, and that the comparator has just turned off into $-U$, this voltage $-U$ is fed into the integrator through resistor 24 so that amplifier 20 integrates from $-V$ to $+V$.

When output voltage (h) from amplifier 20 reaches and exceeds +V, the comparator 21 turns on from −U to +U and the control circuit 5 receives a pulse.

The circuit 5 then changes its state and gives an order (a) to gate 28 that causes switches 22 and 27 to switch to (0-1).

Voltage −V is then applied to the negative input of comparator 21 that remains in its output state +U. Simultaneously since switch 27 is on (0-1), capacitor 26 discharges and output (h) of amplifier 20 turns off almost instantaneously from +V to −V.

This voltage −V is transmitted by way of resistor 23 to the positive input of amplifier 21, which causes this amplifier to switch to −U. Circuit 5 changes its state and gives an order to gates 22 and 27 that turn back to (0-2). The cycle begins anew.

Comparator 3 comprises only an amplifier 30 that receives on its negative input the output signal (m) from the summing device 1 via the resistor 31, and on its positive input the output signal (h) from the ramp generator 2 via a resistor 32.

Consequently, output (n) of comparator 3 has the value −N when (m) is large than (h) and the value +N when (m) is smaller than (h).

The transmitter 4 comprises a transistor 40 the base of which is fed from the output signal from comparator 3 through a resistor 41.

The base of transistor 40 is grounded through a resistor 42 that sets its base voltage and a diode 43 which eliminates the negative part of the input signal of transmitter 4. Resistor 42 and diode 43 are connected in parallel. A light emitting diode 44 is connected in the collector circuit of transistor 40 in series with a resistor 45 that limits the diode current to a permissible value.

In the example shown in FIG. 1, the transmitter 4 is a photo coupling device but any type of transductor may of course be used. It can be seen that the diode 44 emits pulses (p) that presents the same characteristics as the positive part of the output signal from comparator 3.

Control circuit 5 may be realized in a well known manner as an R-S flip flop receiving on its input, in addition to voltages v and u, a trigger signal (r) that makes it possible to synchronize the function generator with an outside clock.

The operation of the circuit of FIG. 1, will now be described with reference to FIGS. 2a, 2b and 2c when no signal (s) is received.

Figure 2:
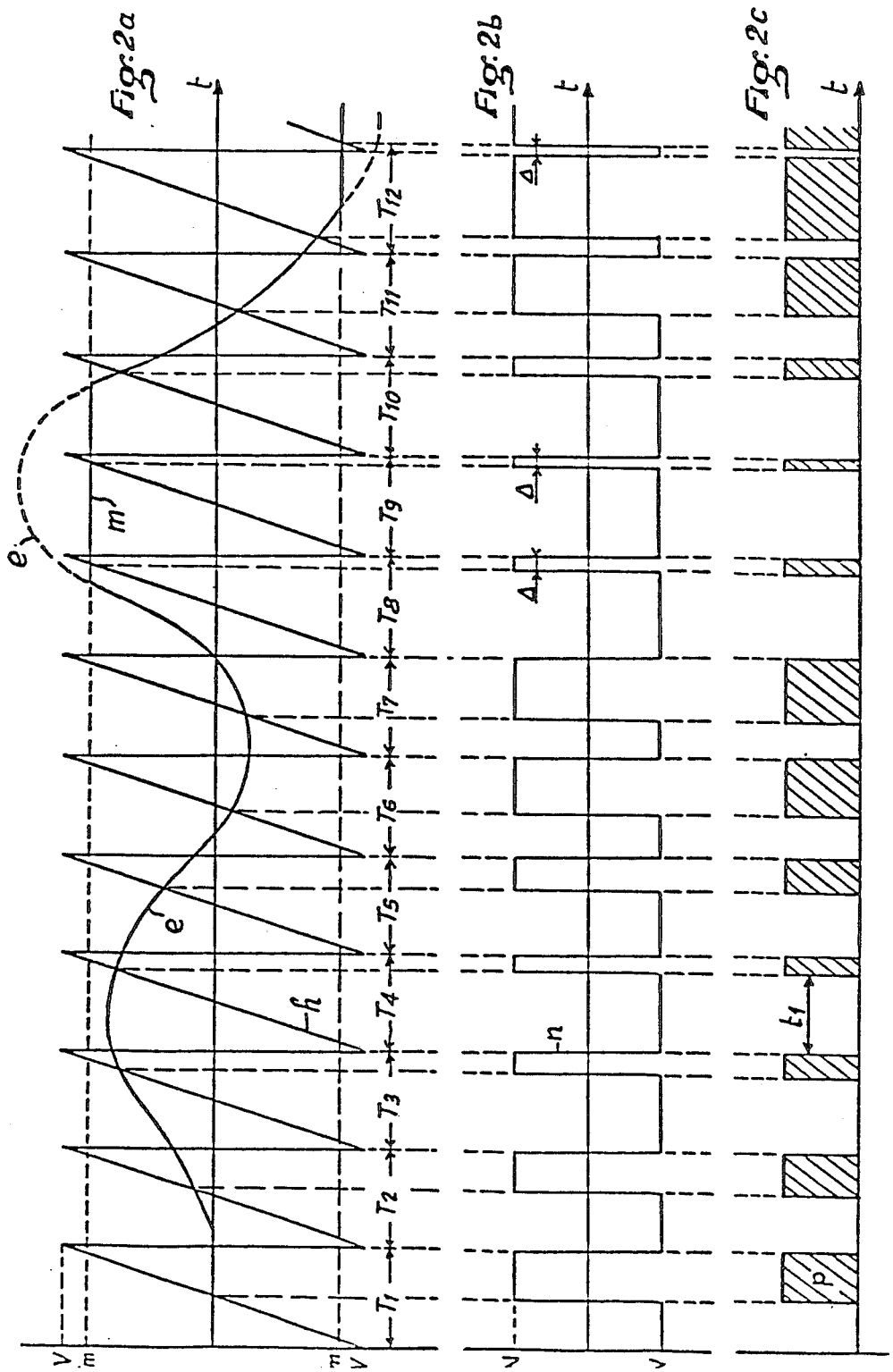
FIG. 2a to 2c show the operation of the circuit of FIG. 1.
Figure 4:
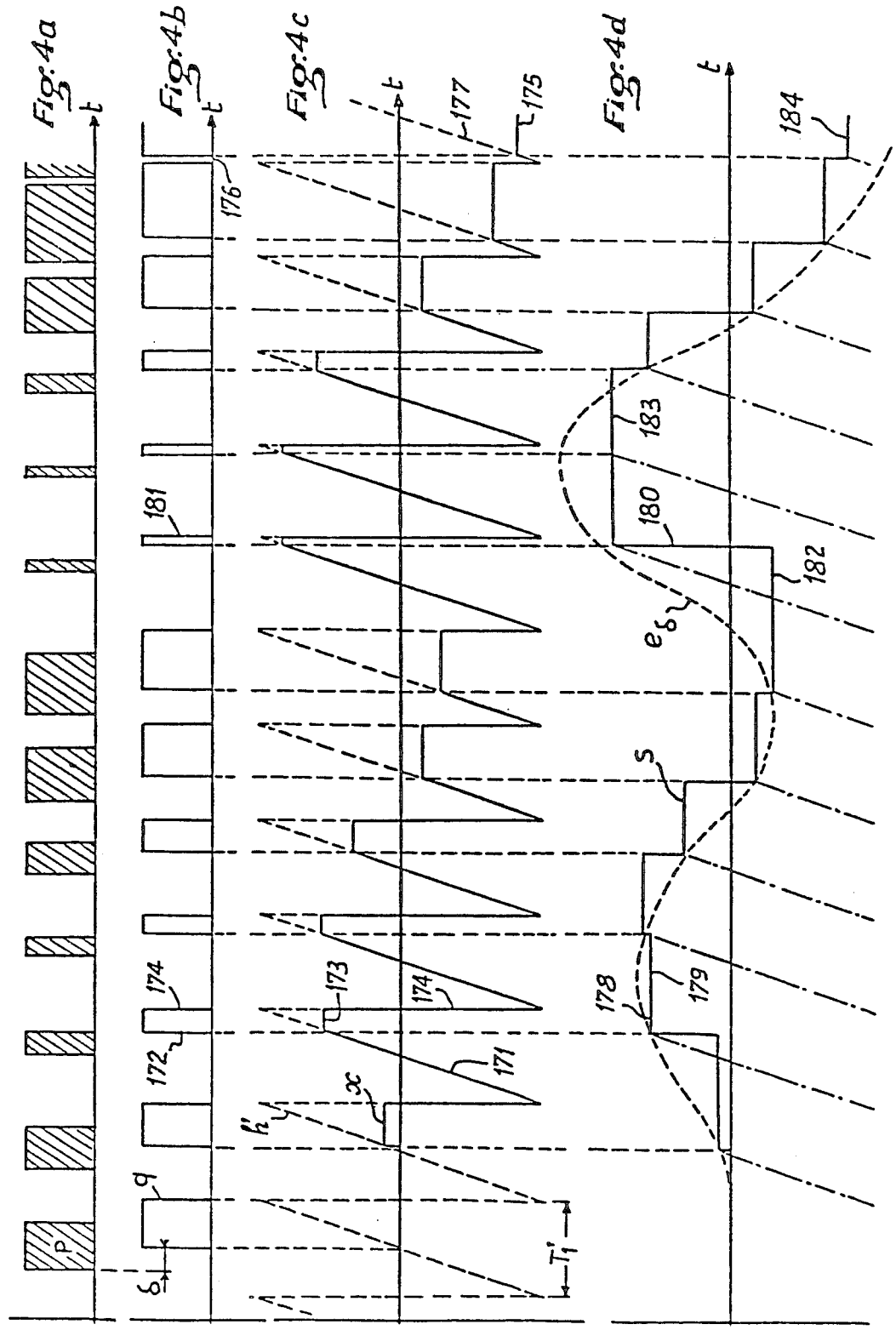
FIG. 4a to 4d show the operation of the circuit of FIG. 3.

FIG. 2a represents the variations of the output signal of ramp generator 2 as a function of time as well as of signal (e) and signal (m) from the peak limiting summing device 1. Of course, since signal (s) is taken as zero, signal (m) is different from signal (e) only when this latter exceeds the peak values set by Zener 13 and 13'. In such a case, signal (m) is a constant equal to +Vm if (e) is positive and to −Vm if (e) is negative.

FIG. 2b shows the corresponding variations of signal (n) from comparator 3 and FIG. 2c shows the pulses (p) emitted by transmitter 4.

When input signal (e) is zero as is the case during the first time period T1 of ramp (h), the comparator 3 provides a square pulse signal (n) of equal positive and negative pulse durations, the signal (n) being equal to −N when (h) varies from −V to 0 and equal to +N when (h) varies from 0 to +V.

On the contrary, when (e) takes positive values as is the case for periods T2 to T5, the positive pulses of (n) have a duration shorter than the half period whereas when (e) takes negative values as is the case for periods T6 and T7, the positive pulses of (n) last for more than one half period.

It will be seen as a consequence that the duration of the position pulses of (n) varies as a reverse function of the value of signal (e).

During periods T8 and T9, signal (e) exceeds the value +Vm. It is thus cut off at this latter value by the peak limiting summing device 1 so that even in this case, a positive pulse of minimal width Δ appears on the output of comparator 3.

Periods T10 and T11 show a normal operation again, period T10 with a positive signal (e) and period T11 with a negative signal (e). Period T12 at late shows the case where signal (e) becomes less than −Vm. In this case, due to the cutting off, signal (n) nevertheless becomes negative during a minimal time Δ.

Pulses (p) may be derived immediately from signal (m) since they correspond to the positive pulses of the latter. It will be understood in particular that a pulse is transmitted for each cycle of the signal (h) even if signal (e) becomes higher than signal +V because in this case signal (n) has a positive pulse of width Δ. In the same way, pulse (p) cannot overlap two cycles of ramp (h) even when signal (e) becomes less than −V since signal (n) has in this case a negative pulse of width Δ.

It can be seen as a consequence that the circuit of FIG. 1 makes it possible to realize the conversion of an analog input signal (e) into an output pulse signal (p). At each cycle of the function generator, the value of signal (e) is converted into a duration equal to time $t_1$ elapsed between the beginning of the cycle and the leading edge of the pulse (p).

In the present case, the trailing edge of the pulse (p) corresponds to the beginning of the next cycle so that a modulation of the duration of pulses (p) is in fact accomplished by signal (e). However, the duration of pulses (p) has no significance in the direct conversion and one could easily design a circuit that would for instance provide pulses with constant width.

It will nevertheless be seen later on that it can be useful in some circumstance to have the trailing edge of the pulses coincide with the beginning of the next cycle so as to synchronize a reverse converter that has to regenerate an analog signal from the pulse signal (p).

Such a reverse converter will now be described with reference to FIG. 3.

This converter is mainly made of a receiver 101, a ramp generator 102 that provides the standard signal of the reverse converter, a decoding sample-hold 103 and a memorization sample-hold 104.

In this case, receiver 101 is a photo-transistor 110 the base voltage of which is set by a resistor 111. A second resistor 112 connected between the collector of transistor 110 and the power feeding makes it possible to deliver, at this collector, a square pulse signal (q) corresponding to the pulses (p) and merely delayed with respect to these latter ones by a delay corresponding to the transmission time.

Control circuit 105 (CC2) is similar to control circuit 5 in FIG. 1 except that its synchronization input receives the signal (q) as a synchronization signal instead of an outside clock signal.

In this case, it is of course the trailing edge of signal (q) that is used for the synchronization as mentioned above.

The function generator 102 is identical to function generator 2 in FIG. 1 and will not be described any further. Its purpose is to deliver a ramp (h') that is identical in this case to ramp (h) from circuit 2.

The decoding sample-hold 103 comprises a first amplifier 130 with a great input impedance that can operate as an inverter or follower. The output (h') of the ramp generator is applied to the positive input of the amplifier 130 via a resistor 131.

The amplifier 130 is followed by an electronic switch 132 controlled by a gate 133 itself controlled by signal (f-q) coming from the control circuit 105, f representing the duration of a cycle of the ramp generator and q that of a pulse.

Switch 132 transmits, when closed in (0-1), the output voltage of amplifier 130 to a capacitor 134 that is used as an analog memory.

The voltage from capacitor 134 is applied to the positive input of a second amplifier 135 with a very great input impedance set as a follower. Output (x) of amplifier 135 is fed back directly onto its negative input and, through a resistor 136, to the negative input of the amplifier 130.

When switch 132 is closed, sample-hold 103 operates in COPY mode i.e. its output (x) follows its input (h'). In this operation mode the voltage on the terminals of capacitor 134 is equal to (h').

If a signal (f-q) is applied to gate 133, the latter opens the switch 132 thus disconnecting input (h') from output (x).

This output then remains equal to the voltage on the terminals of capacitor 134 so that, insofar as the latter remains a constant, output (x) retains the last value of input (h') before the opening of switch 132. Sample-hold 103 is in the HOLD mode.

Another pulse applied to the input of gate 133 causes anew the closing of switch 132 and the sample-hold goes back into COPY mode.

Memorization sample-hold 104 is similar to decoding sample-hold 103 and will thus be described no further except to say that its switch 142 is controlled by a gate 143 that is itself controlled by a signal (q).

It can be noticed however that output (x) from sample-hold 103 is applied to the input of sample-hold 104 by way of a summing device 106.

The summing device 106 is made in a well known way of an amplifier 160 the positive input of which is grounded and the negative input of which receives on the one hand the signal (x) through a resistor 161 and on the other hand the output signal (s) from sample-hold 104 through a resistor 162. The output from the amplifier 160 is also fed back onto its negative input via a resistor 163.

Finally, a switch 164 allows to close the loop 162 when it is on (0-1) and to open it when it is on (0-2).

The operation of the circuit of FIG. 3 will now be described with reference to FIGS. 4a to 4d.

FIG. 4a reproduces the pulses (p) of FIG. 2c. FIG. 4b represents the pulses (q) from the output of receiver 101 delayed with respect to pulses (p) by a delay of time δ. FIG. 4c represents the standard signal (h') and the output signal (x) from decoding sample-hold 103. FIG. 4d represents the output signal (s) from memorization sample-hold 104 as well as, in dotted line, a reminder (e) of signal (e) that was the origin of pulses (p), delayed by the delay of time δ.

FIG. 4c displays more particularly the operation of decoding sample-hold 103. Since switch 132 is closed, the sample-hold 103 is on COPY mode and thus signal (x) follows signal (h') as for instance in 171. When the leading edge 172 of a pulse (q) arrives, the control circuit 105 sends to gate 133 a signal (f-q) that causes the turning on of that gate and the opening of switch 132. The sample-hold 103 is then on HOLD mode and its output (x) remains at a constant voltage equal to the laser value it had before the opening of switch 132. This is shown for instance by signal 173 in FIG. 4c.

When the trailing edge 174 of pulse (q) arrives, control circuit 105 sends to gate 133 another pulse that causes it to turn off and consequently causes the closing of switch 132 and sets the sample-hold 103 back into COPY mode. Signal (x) follows signal (h') again like in 174.

It can be seen first on the first cycle T'1 of signal (h') that a signal (q) with positive and negative portions with equal duration (let it be reminded that this implies an input signal (e) equal to zero) involves a signal (x) equal to zero.

Besides, the effectiveness of the negative marker as described above can be seen in 175. Indeed, failing that marker, the signal (q) would not get back to 0 as in 176, no leading edge would be detected by control circuit 105, and consequently signal (x) would keep following signal (h') in 177. The negative marker thus makes possible the resetting of sample-hold 103 in case signal (e) becomes smaller than the minimal value of ramp (h). The difference between this minimal value −V and the cut-off value −Vm is chosen so that sample-hold 103 has enough time to be reset into HOLD mode.

Sample-hold 104 is controlled by circuit 105 by means of a signal (q) so that it is on HOLD mode when sample-hold 103 is on COPY mode and that it is on COPY mode when sample-hold 103 is on HOLD mode.

Consequently when the leading edge 172 of a pulse (q) arrives, sample-hold 104 sets on COPY mode so that its output follows output (x) of the sample-hold 103 as in 178. When the trailing edge 174 of pulse (q) arrives, sample-hold 104 sets on HOLD mode so that its ouptut (s) retains in 179 the value it had in 178.

Sample-hold 104 thus ensures the memorization of the decoded signal (x) until the arrival of the next pulse.

It can be noticed in 180 how the positive marker described above is effective. Indeed, without this marker pulse (q) 181 would not exist so that output (s) from sample-hold 104 would retain the value it had in 182 during the previous cycle.

It can be seen from FIG. 4d that the circuit on FIG. 3 generates a signal (s) that is the same as input signal (e) in the circuit of FIG. 1, delayed in time by the delay of time δ, cut off as in 183 or 184, and sampled.

However it should be noticed that this sampling is different from the usual one. Actually, one sample values does appear for each cycle of ramps (h) and (h°), but the sampling is not a periodic one. Indeed, the time when it takes place depends on the value of input signal (e).

Figure 5:
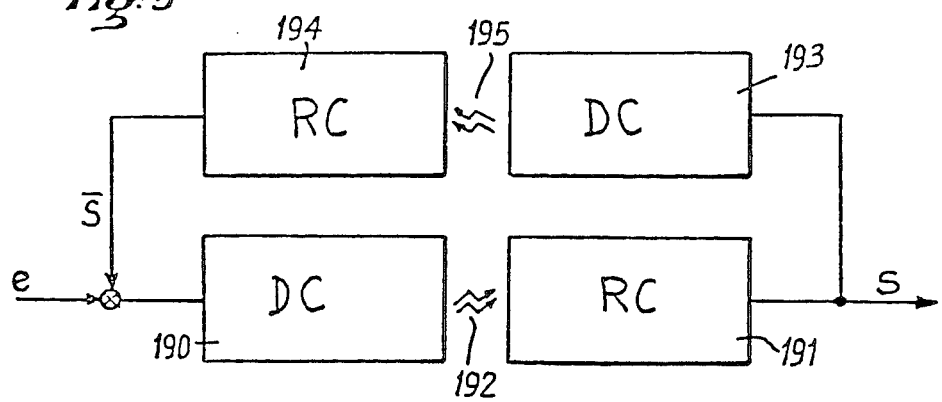
FIG. 5 shows a closed loop signal transmission system according to the invention.

FIG. 5 is a block diagram showing the operation of the devices of FIGS. 1 and 3 in closed loop.

This diagram includes on its direct loop a circuit 190 identical to that of FIG. 1 and a circuit 191 as illustrated in FIG. 3. These two circuits are coupled in 192 by any convenient means, for instance by optical means such as those described above.

The feed-back loop also comprises a circuit 193 such as that on FIG. 1 and a circuit 194 such as that on FIG. 3 coupled in 195.

In this arrangement the signal (s) inverted is transmitted by feed-back loop 193-194 for its reinjection on input 11 of circuit 190. Consequently the direct loop transmits only the difference between input signal (e) and output signal (s). Therefore, switch 164 on circuit 191 is set on (0-1) so as to add on summing device 106 the signal (x) representative of the difference signal and the output signal (s).

Of course, input 11 of circuit 193 is not used in this case and switch 164 of circuit 194 is on (0-2). Indeed the only purpose of the feed-back loop is to forward output voltage (s) as fast as possible to input 11 of circuit 190.

One of the main advantages of the invention can be noticed here. It has just been shown indeed how the device can operate in closed loop with circuits 190 and 191 in the direct loop between input (e) and output (s) circuits 193 and 194 in the feed-back loop between output (s) and input (e). It is enough to open the switch 164 of circuit 191 and to close that of circuit 194, to disconnect the input 11 of circuit 190, and to connect the output of circuit 191 to the input 11 of circuit 193, in order to be able to operate in closed loop in the opposite direction.

It is also possible to operate in two open loops by disconnecting the inputs 11 of both circuits 190 and 193 and by opening switches 164 of circuits 191 and 194.

Another advantage of the arrangement of FIG. 5 is to have a regulation with a proportional gain. Indeed, as soon as the first cycle is transmitted, an output value corresponding to the input signal can readily be obtained. Signal (s) comes back in opposition on input 11 of circuit 190 with a delay equal to 2δ.

As soon as the second cycle is generated, the regulation transmits the difference (e−s) or (e+s) so that, this difference being small, the direct signal transmitted is centered around the 0 volt of the function generator which is the value where the system has the best accuracy.

It can thus be ensured that the system operates in closed loop at its optimum precision level.

Besides, this arrangement lends itself easily to the multiplexing of analog signals.

Multiplexing is done directly on the input signals in 10 and 11 of circuits 190 and 193 and demultiplexing is effected by disconnecting sample-holds 103 and 104 of circuits 191 and 194 at the inputs 161 and 162 of summing devices 160.

Moreover, an important advantage of the arrangement of FIG. 5 used as a data acquisition system together with a multiplexing of signals comes from the fact that the clock in the multiplexing system can be used for synchronizing the function generators of the direct and reverse conversion devices. For instance by means of a 16 channels multiplexor one can send 15 signals, the 16th channel being used for the synchronization pulse.

Only linear standard signals as provided by ramp generators 2 and 102 of the respective direct and reverse conversion devices have be considered so far. It will now be shown that any other type of standard signal can be used.

First, if both standard signals in the direct and reverse conversion devices are identical, the output signal (s) will obviously be identical to the input signal (e) whatever the shapes of these two standard signals except for the distorsions mentioned above in reference to FIG. 4, delay, cut-off and sampling. However, if the transmission delay is negligible, if the input signal does not exceed the minimal admissible values, and if the frequency of the function generators is great with respect to the rate of evolution of the input signal, the input and output signals can be regarded as identical.

Moreover it can easily be noticed that if the standard signals of direct conversion and reverse conversion devices are different, the ouput signal takes the value of the standard signal of the reverse conversion each time the standard signal of the direct conversion reaches the value of the input signal.

These two remarks make it possible to draw by simply recording the time the output signal (s) from the input signal (e) and the standard signals. The results of the use of various standard signals for direct as well as for reverse conversion will now be observed on FIGS. 6a to 6c.

Figure 6A:
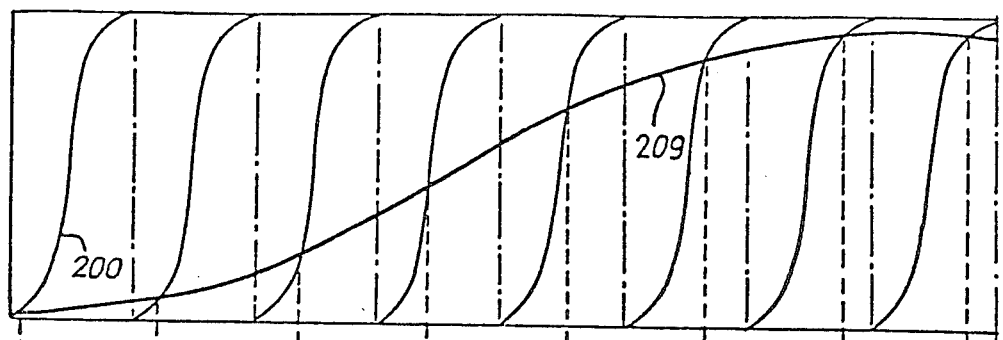
FIG. 6a to 6c show the operation of other embodiments of the circuits of FIGS. 1 and 3.
Figure 6B:
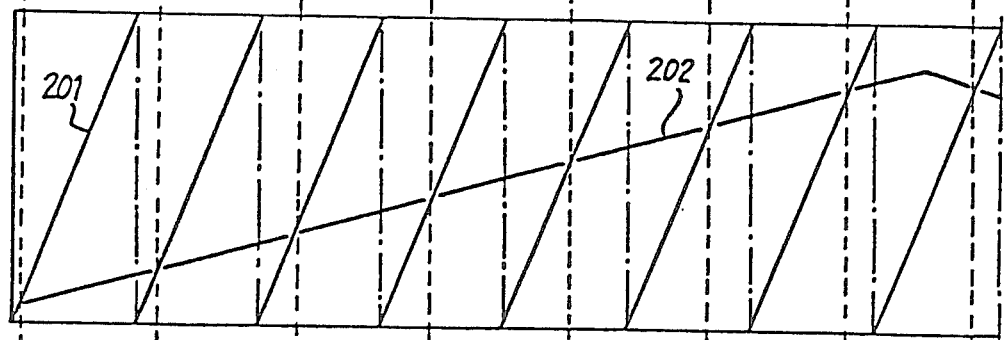

FIGS. 6a and 6b when taken in that order in combination illustrate the case where the standard signal of the direct conversion device is a half sinusoid 200 and where the standard signal of the reverse conversion device is a ramp 201. It has been seen that output signal 202 can be drawn from the input signal 203 by recording the times as has been done on the figures.

It will be understood that if the input signal 203 is half sinusoid with a frequency small with regard to that of the standard signal, the output signal 202 is a straight line.

FIGS. 6a and 6b being completely reversible it is obvious that if a ramp 201 is used as a standard signal for the signal direct conversion and the half sinusoid 200 as a standard signal for the reverse conversion, the output signal 203 is a half sinusoid for a ramp 202 as input signal.

It can be seen how the devices according to the invention make it possible to realize a transformation of curves. In the examples of FIGS. 6a and 6b it is possible for example to obtain sinusoids of very small frequency from ramps that are easy to produce.

Figure 6C:
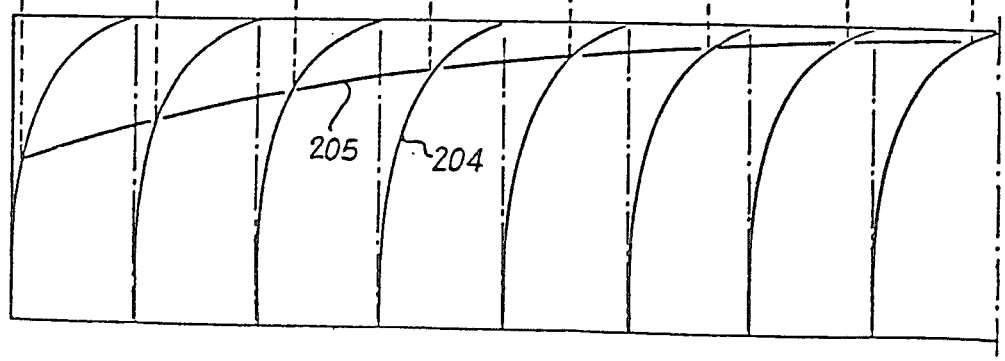

A combination of FIGS. 6a and 6c in that order illustrates the case where the standard signal of the direct conversion device is an exponential 204 and the standard signal of the reverse conversion device is a ramp 201. In the case where the input signal is also an exponential 205, the output signal 202 is a ramp.

It can thus be seen how it is possible to linearize the output of a sensor that has an exponential characteristic.

The various possible combinations of FIGS. 6a to 6c show how to convert a sinusoid into an exponential or reversely how to get an exponential from a sinusoid.

Of course this conversion of curves can be applied to all curves or combination of particular curves.

Figure 7:
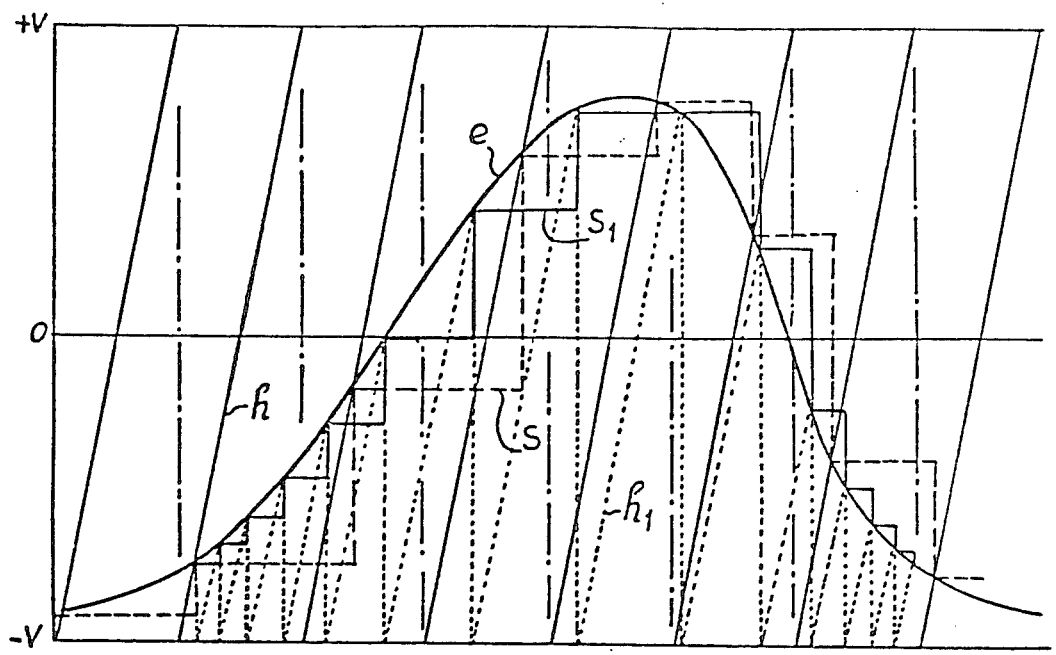

FIGS. 7 and 8 graphically show the results that are obtained by means of other embodiments of the invention resulting from modifications of the devices show in FIGS. 1 and 3.

FIG. 7 shows that it is possible to improve the output signal (s) at least for the negative values of input signal (e) by beginning a new cycle of the standard signal as soon as its value reaches that of the input signal. Whilst the standard signal (h) previously described returned to value −V only after reaching +V, signal (h$_1$) as considered now returns to −V as soon as it has reached the value of the input signal (e).

For that purpose it is enough to control through circuit 5 switches 22 and 27 of the ramp generator 2 so that they immediately switch after comparator 3. The delay between the turn off of comparator 3 and the turn on of switches 22 and 27 is determined in such a way as to get a pulse (p) of a width sufficient to enable samplehold 104 of the reverse conversion device to reach the value of sample-hold 103 in COPY mode.

It will be understood that, on FIG. 7, the output signal ($s_1$) follows more closely the input signal (e) than output signal (s), and that this is particularly true when signal (e) is negative.

FIG. 8 shows in 210 that it is possible to reach the same benefit whatever the sign of the input signal (e).

All that is needed for that purpose is to have two ramp generators (h), one positive and the other negative. Two pulses are then obtained each corresponding to one sign of the input signal. Two emitting circuits are then needed, thus two decoding devices in the reverse conversion device, but a single memorization circuit 101 is enough.

FIG. 8 also shows in 211 that it is also possible to greatly improve output signal ($s_2$) by using as a reference value for standard signal ($h_2$), instead of the fixed value $-V$, a value $V_2$ deducted from the previously sampled value. In the case of FIG. 8 this value $V_2$ is equal to the previous sampled value from which a predetermined voltage $V'$ has been substracted.

This may be obtained with the adaptive devices represented in FIGS. 9 and 10 that will now be described.

The same references will be used with regard to the circuits common to FIGS. 9 and 10 on one hand and to FIGS. 1 and 3 on the other hand.

Signal (e) in open loop or (e+$s_2$) in closed loop, is applied to the input of a sample-hold 300, the output of which is applied on one hand to the negative input of comparator 3 and on the other hand to the input of a sample-hold 301.

Voltage $-V'$ is added to the output voltage of sample hold 301 in a summing device 302.

A switch 303 has its output connected to either voltage $-V$ when in (0-1) or to the output of summing device 302 when on (0-2). Another switch 304 has its output connected either to the output of switch 303 when in (0-1), or to voltage $+V$ when on (0-2).

The output of switch 304 is applied to the input of function generator 2 the output of which is connected to the positive input of comparator 3. The output of this comparator is applied as previously to the input of emitter 4. A control circuit 305 that receives on one hand the output of comparator 3 and on the other hand reset pules 306 controls switches 307 and 308 of sample-hold 300 and 301 respectively as well as switches 303 and 304.

FIG. 10 shows the reverse convertor of the adaptive device.

A summing device 310 adds voltage $-V'$ to the output ($s_2$) of the reverse conversion device so as to generate the reference value of function generator 102.

The output of switch 311 is connected either to voltage $-V$ or to the output of summing device 310 and the output of switch 312 is connected either to the output of switch 311 or to voltage $+V$.

The output of switch 312 is applied to the input of function generator 102. A control circuit 313 receiving pules (q) from receiver 101 and a reset signal 314 controls both switches 311 and 312, the switches of function generator 102 as well as the switches of sample-holds 103 and 104.

In the circuit of FIG. 9, sample-hold 300 causes the value of the input signal to be memorized when this value is reached by the standard signal. For that purpose, switch 307 is controlled by a signal 320 so that sample-hold 300 is on COPY mode at the beginning of the cycle of the standard signal and that it then turns off to go on HOLD mode when comparator 3 has detected the equality between the input signal and the standard signal.

Sample-hold 301 is controlled by circuit 305 by means of a signal 321 so that it is on HOLD mode when sample-hold 300 is on COPY mode and reversely.

The combined operation of sample-holds 300 and 301 is identical to what has been described above with respect to sample-holds 103 and 104.

Voltage $-V'$ is added to the output voltage of sample-hold 301 in the summing device 302 and, during normal operation, switch 303 is on (0-2) and switch 304 is on (0-1). It is understood that the reference voltage thus provided to the input of function generator 102 is the input voltage increased or descreased by voltage $V'$.

In the reverse conversion device of FIG. 10 as well, switch 311 when in normal operation is on (0-2) and switch 312 is on (0-1). Thus the reference value fed to the input of the function generator 102 is equal to the output voltage ($s_2$) from which voltage $V'$ is substracted.

FIG. 11 illustrates the combined operation in open loop of the circuits of FIGS. 9 and 10.

At the beginning switches 303 and 311 are on (0-1) and switches 304 and 312 are on (0-2). Thus the second function generator generates a half ramp 320 causing the emission of a pulse coded 0 when it reaches 0 volt. This 0 pulse causes by its trailing edge the starting of function generator 102 of the reverse conversion device. This trailing edge of pulse 1 then causes the turn on of switches 303, 311 and 312 so that the system is now in adaptive mode since the reference value of the ramp generator is now equal to the value of the previous sampling decreased by $V'$ volts.

The switch 307 of sample-hold 300 also turns on at that time so that this sample-hold operates in COPY mode and the input voltage is transmitted to comparator 3 via line 321. When the voltage 322 at the output of function generator 2 reaches the value of the output signal of sample-hold 300, comparator 3 turn on and this change is detected by circuit 305 through line 323.

Circuit 305 then emits signals 320 and 321 that cause the turn of sample-hold 300 onto HOLD mode and the turn of sample-hold 301 to COPY mode.

The standard ramp goes on until control circuit 305 emits a signal 323 causing the initialization of a new cycle of function generator 2.

Simultaneously, sample-hold 300 goes back into COPY mode whilst sample-hold 301 goes back to HOLD mode. The reverse conversion device of FIG. 10 operates in a similar way to that of FIG. 3 except that summing device 310 provides as a reference value the value of the output signal ($s_2$) increased or descreased by voltage $V'$.

As in the direct conversion device of FIG. 9, switches 311 and 312 that are originally connected to voltage $-V$ and $+V$ respectively, turn to the adativ mode following pulse 0. It can be noted moreover that each time a predeterminted number of cycles have been effected in the adaptive mode, a cycle may be effected with the half standard signal so as to reset the reverse conversion device onto the direct conversion device.

In closed loop, the switch 164 of the reverse conversion device will be set on (0-2) by control circuit 313 at the end of pulse 0. However, difficulties arise when the adaptive mode is used with a nonlinear standard signal 350 as shown in FIG. 14.

If the equality between this standard signal and the signal to convert is detected for a value ($e_1$) of the voltage as in 351, it remains possible to substract the voltage V' from this voltage ($e_1$) so as to obtain the new reference value ($e_1-V'$).

However it is generally not possible to restart the standard signal 350 from ($e_1-V'$) if this standard signal is obtained by analogical means. The second cycle 352 of the standard signal will therefore deviate from signal 350 in an unacceptable way.

The diagram of FIG. 16 shows a device designed to solve this problem by digital means.

This device comprises a clock 360, the pulses of which are counted in a counter 361. A converting device 362 is arranged to derive the value of the standard signal 350 for each value of the counter 361, that is for each instant of time t. The comparison with the input signal (e) is done as hereinabove in a comparator 363 connected to an emitter 364 which emits a signal 365 when the comparator 363 detects the equality between the signal (e) and the outpout signal from the converting device 362.

This equality has been detected after $N_1$ clock pulses (FIG. 14) and the counter 361 is shifted rearwards in 366 of $N_2$ clock pulses (FIG. 15). This shifting is realised when the emitter 364 sends to the counter a reset signal 367 signifying the completion of the emission of signal 365.

FIG. 15 shows that the counter 361 starts again to count from $N_1-N_2$ and that the converting device 362 then generates the corresponding part 368 of the standard signal 350.

FIGS. 12 and 13 show two particular applications of the invention.

FIG. 12 represents a temperature regulator in which the reference of temperature is given by potentiometer 400.

This reference value decreased by return signal $\theta$ is applied to the input of a direct conversion device 401, for instance such as that described in reference to FIG. 1.

The pulses (p) emitted by conversion device 401 are directly used for controlling thyristors 402 that feed resistors 403.

A sensor detects on these resistors the temperaure $\theta$ that is transmitted by a feedback loop made of a direct conversion device 404 and a reverse conversion device 405, such as those described for instance with reference to FIGS. 1 and 3 respectively.

FIG. 13 represents a regulator with two loops that also makes use of the invention. It is a speed regulator for a DC motor 410 fed by a single phase AC.

An internal current loop is made of a direct conversion device 411 generating pulses (p) used as above for controlling a thyristors bridge 412 that feeds the motor 410.

The external loop is the speed loop. A summing device 413 receives the reference speed 414 as well as the actual speed value transmitted by the feed-back loop made of a direct conversion device 415 and a reverse conversion device 416 as described for instance with reference to FIGS. 1 and 3.

The output of summing device 413 is applied to an amplifier 417 the output of which is added in a summing device 418 to the value of the speed transmitted by the internal feed-back loop.

The measure of the speed transmitted by converter 415 is best given by the C.E.M.F. at the terminals of motor 410 as measured outside the periods when this motor is fed through the thyristors bridge 412.

SUMMARY OF SYMBOLS a: central signal of the ramp generator (2) of the direct converter.
e: analog input signal to direct converter.
f: central signal of the ramp generator (102) of the reverse converter.
m: output of the summing device (1) of the direct converter.
n: output of the comparator (3) of the direct converter.
p: pulses from the emitter (4) of the direct converter.
q: pulses from the receiver (101) of the reverse converter.
v: trigger signal of the central circuit (5).
s: output signal from the reverse converter.
u: output signal from the comparator of the ramp generator (2) of the direct converter.
v: reference voltage of ramp generators (2) and (102).
x: output signal from sample-hold (103).

What is claimed is:

1. A transmission system for transmitting an analog signal in closed loop including on its direct loop:
    a summing device, substracting the transmitted signal from the signal to be transmitted,
    a first direct conversion device on the input of which the output signal from the summing device is applied, comprising first function generating means for generating a first standard signal, comparison means for comparing said analog signal to said first standard signal, emitting means for emitting a pulse when the comparison means detects the equality between the analog signal and said first standard signal;
    a first reverse conversion device comprising receiving means for receiving the pulses from said first direct conversion device, second function generating means for generating a second standard signal, means for synchronizing said second standard signal with said first standard signal, and means for memorizing the value reached by said second standard signal upon reception of a pulse;
    means for coupling the output from the first direct conversion device to the input of the first reverse conversion device; and
    means for feeding the output from the first reverse conversion device back onto itself.

2. A transmission system according to claim 1, wherein the feedback loop includes:
    a second direct conversion device on the input of which is transmitted signal is applied, comprising third function generating means for generating a third standard signal, comparison means for comparing said analog signal to said third standard signal, emitting means for emitting a pulse when the comparison means detects the equality between the analog signal and said third standard signal;
    a second reverse conversion device comprising receiving means for receiving the pulses from said second direct conversion device, fourth function generating means for generating a fourth standard signal, means for synchronizing said fourth standard signal with the third standard signal, and means for memorizing the value reached by said fourth standard signal upon reception of a pulse, the output of said second reverse conversion device being applied to the input of the summing device; and means for coupling the output from the second direct conversion device to the input of the second reverse conversion device.

3. A conversion device for converting an analog signal into a pulse signal comprising function generating means for generating a standard signal, comparison means for comparing said analog signal to the standard signal, and emitting means for emitting a pulse when the comparison means detects the equality between the analog signal and the standard signal, and comprising first sample-hold means on the input of which said analog signal is applied, second sample-hold means on the input of which the output of the first sample-hold means is applied, means for setting the first sample-hold means to the HOLD mode and the second sample-hold means to the SAMPLE mode when said comparison means detects the equality between the analog signal and the standard signal, and for setting the first sample-hold means back to the SAMPLE mode and the second sample-hold means back to the HOLD mode at said predetermined instants of time when the next standard signal starts to be generated, and means for deriving from the output of said second sample-hold means said reference value of the standard signal.

4. A device according to claim 3, wherein said function generating means is so arranged as to generate a ramp with a vertical step.

5. A device according to claim 4, wherein said function generating means is arranged so that the end values of the ramp are greater in absolute value than the maximum value of said analog signal.

6. A device according to claim 3, wherein said means for deriving said reference value from the output of said second sample-hold means include a summing device in order to add algebraically a predetermined quantity to said output.

7. A device according to claim 3, wherein the input of said comparison means corresponding to the analog signal is connected to the output of said first sample-hold means.

8. A device for converting back a pulse signal obtained by means of a device according to claim 3, into an analog signal comprising receiving means for receiving the pulses of the pulse signal, second function generating means for generating the second standard signal, means for synchronizing said second standard signal with the first standard signal, and means for memorizing the value reached by said second standard signal upon reception of a pulse, said means for memorizing the value of said second standard signal including third sample-hold means the input of which is connected to the ouput of said second function generating means and means for setting said third sample-hold means to the HOLD mode when said pulse is received and for setting them back to the SAMPLE mode at said instants of time when the next standard signal starts to be generated.

9. A device according to claim 8, wherein said means for memorizing the value of said second standard signal further include fourth sample-hold means the input of which is connected to the output of said third sample-hold means, means for causing said fourth sample-hold means to be in the SAMPLE mode when said third sample-hold means are in the HOLD mode, and for causing said forth sample-hold means to be in the HOLD mode when said third sample-hold means are in the SAMPLE mode.

10. A regulation system including a direct loop and a feed-back loop wherein said direct loop includes: at least a direct conversion device comprising first function generating means for generating a first standard signal, comparison means for comparing the input of said device to the standard signal, emitting means for emitting a pulse when the comparison means detects the equality between the input signal and the standard signal; and means for providing to the input of said device an analog signal equal to the difference between a control signal and the feedback signal.

11. A system according to claim 10, wherein said means for providing the difference signal includes an amplifier with proportional gain.

12. A method for converting an analog signal into a pulse signal consisting in cycles each comprising: generating a first standard signal varying from a reference value at a predetermined instant of time; comparing the analog signal from said instant of time to said standard signal; emitting a pulse when the value of the standard signal reaches that of the analog signal, deriving the reference value for the next cycle from the value the analog signal had when said pulse was emitted, and continuing said pulse until said predetermined instant of time of the next cycle.

13. A method for converting an analog signal into a pulse signal consisting in cycles each comprising: generating a first standard signal varying from a reference value at a predetermined instant of time; comparing the analog signal from said instant of time to said standard signal; emitting a pulse when the value of the standard signal reaches that of the analog signal, deriving the reference value for the next cycle from the value the analog signal had when said pulse was emitted, and wherein said standard signal is a periodical signal, said predetermined instants of time of two adjacent cycles being separated by a time interval equal to the period of said standard signal.

14. A method for converting an analog signal into a pulse signal consisting in cycles each comprising: generating a first standard signal varying from a reference value at a predetermined instant of time; comparing the analog signal from said instant of time to said standard signal; emitting a pulse when the value of the standard signal reaches that of the analog signal, deriving the reference value for the next cycle from the value the analog signal had when said pulse was emitted, and wherein said predetermined instants of time are the instants of time when the standard signal has reached the value of the analog signal during the previous comparison.

15. A method according to either claim 13 or claim 14, wherein said reference value for the next cycle is equal to said value of the analog signal to which is algebraically added a predetermined quantity.

16. A method according to either claim 13 or claim 14, wherein that said standard signal is a ramp signal.

17. A method according to either claim 13 or claim 14, further comprising, in order to generate said standard signal, counting the pulses from a clock in a counter and converting the contents of the counter at each pulse from the clock into an analog signal.

18. A method for converting back a pulse signal obtained through the method according to either claim 13 or claim 14 into an analog signal, consisting in cycles each comprising: generating a second standard signal varying from a second reference value at an instant of time that is synchronized with said pulse signal; recording the value of the second standard signal at the time when a pulse is received; memorizing said value until the next pulse is received; and deriving the reference value for the next cycle from the value the analog signal had when said pulse was received.

19. A method according to claim 18 wherein said second standard signal has a shape different from that of said first standard signal.

20. A method according to claim 18 wherein said second standard signal is substantially identical to the first standard signal.

21. A method according to claim 18, wherein said second standard signal has a reference value and/or a frequency different from that of said first standard signal.

22. A method according to claim 18, comprising synchronizing said second standard signal with the first standard signal by means of the trailing edges of the pulses.

23. A method according to claim 18, wherein said reference value for the next cycle is equal to said value of the analog signal to which is algebraically added a predetermined quantity.

24. A method according to claim 18, wherein said standard signal is a ramp signal.

25. A method according to claim 18, comprising, in order to generate said standard signal, counting the pulses from a clock in a counter and converting the contents of the counter at each pulse from the clock to an analog signal.

26. A method according to claims 23 and 25, comprising, in order to algebraically add said predetermined quantity, shifting the counter a given number of bits.

27. A regulation system including a direct loop and a feed-back loop wherein said direct loop includes: at least a direct conversion device comprising first function generating means for generating a first standard signal, comparison means for comparing the input of said device to the standard signal, emitting means for emitting a pulse when the comparison means detects the equality between the input signal and the standard signal; and means for providing to the input of said device an analog signal equal to the difference between a control signal and the feedback signal, and wherein said direct loop further includes: a reverse conversion device comprising receiving means for receiving the pulses of the pulse signal, second function generating means for generating a second standard signal, means for synchronizing said second standard signal with the first standard signal, and means for memorizing the value reached by said second standard signal upon reception of a pulse; and means for coupling the output from said direct conversion device to the input of said reverse conversion device.

28. A system according to claim 27, wherein said means for memorizing the value of said second standard signal include first sample-hold means the input of which is connected to the output of said second function generating means and means for setting said first sample-hold means to the HOLD mode when said pulse is received and for setting them back to the SAMPLE mode at instants of time when the next standard signal starts to be generated, said means for memorizing the value of said second standard signal further include second sample-hold means the input of which is connected to the output of said first sample-hold means and means for causing said second sample-hold means to be in the SAMPLE mode when said first sample-hold means are in the HOLD mode, and for causing said second sample-hold means to be in the HOLD mode when said first sample-hold means are in the SAMPLE mode, a summing device being connected between the first and second sample-hold means so as to provide at the input of the second sample-hold means a signal equal to the sum of the output signals from the first and second sample-hold means.

29. A regulation system including a direct loop and a feed-back loop wherein said direct loop includes: at least a direct conversion device comprising first function generating means for generating a first standard signal, comparison means for comparing the input of said device to the standard signal, emitting means for emitting a pulse when the comparison means detects the equality between the input signal and the standard signal; and means for providing to the input of said device an analog signal equal to the difference between a control signal and the feed-back signal, and wherein the feed-back loop includes: a second direct conversion device comprising third function generating means for generating a third standard signal, comparison means for comparing the input to said second direct conversion device to said third standard signal, emitting means for emitting a pulse when the comparison means detects the equality between the analog signal and the standard signal, a second reverse conversion device comprising receiving means for receiving the pulses from said second direct conversion device, fourth function generating means for generating a fourth standard signal, means for synchronizing said fourth standard signal with said third standard signal, and means for memorizing the value reached by said fourth standard signal upon reception of a pulse, and further comprising means for coupling the output of said second direct conversion device to the input of said second reverse conversion device.

* * * * *

UNITED STATES PATENT AND TRADEMARK OFFICE
CERTIFICATE OF CORRECTION

PATENT NO. : 4,710,748
DATED : December 1, 1987
INVENTOR(S) : Louis Champavier

It is certified that error appears in the above-identified patent and that said Letters Patent are hereby corrected as shown below:

Cover page - Item [73] "Vita Center Inc., Panama, Panama--

Should read --Louis Champavier--

Signed and Sealed this

Sixth Day of September, 1988

Attest:

DONALD J. QUIGG

*Attesting Officer*       *Commissioner of Patents and Trademarks*